(12) United States Patent
Song

(10) Patent No.: US 11,137,849 B2
(45) Date of Patent: Oct. 5, 2021

(54) TOUCH DISPLAY DEVICE AND MANUFACTURING METHOD THEREOF

(71) Applicant: LG Display Co., Ltd., Seoul (KR)

(72) Inventor: InDuk Song, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/932,419

(22) Filed: Jul. 17, 2020

(65) Prior Publication Data

US 2021/0165515 A1 Jun. 3, 2021

(30) Foreign Application Priority Data

Nov. 29, 2019 (KR) .......................... 10-2019-0156908

(51) Int. Cl.
*G06F 3/041* (2006.01)
*G02F 1/1333* (2006.01)
*G02F 1/1362* (2006.01)

(52) U.S. Cl.
CPC ........ *G06F 3/0412* (2013.01); *G02F 1/13338* (2013.01); *G02F 1/136209* (2013.01); *G02F 1/136286* (2013.01); *G02F 1/136222* (2021.01); *G02F 2201/121* (2013.01); *G02F 2201/123* (2013.01)

(58) Field of Classification Search
CPC ............... G06F 3/0412; G02F 1/13338; G02F 1/136209; G02F 1/136286; G02F 2201/121; G02F 2201/123
See application file for complete search history.

(56) References Cited

U.S. PATENT DOCUMENTS

| | | | |
|---|---|---|---|
| 2007/0171157 A1* | 7/2007 | Choi | G02F 1/13318 345/81 |
| 2012/0188204 A1* | 7/2012 | Yeo | G06F 3/042 345/175 |
| 2016/0260780 A1* | 9/2016 | Kim | H01L 51/0097 |
| 2018/0088713 A1* | 3/2018 | Yang | G06F 3/0446 |
| 2019/0207133 A1* | 7/2019 | Park | G09G 3/3291 |
| 2019/0288048 A1* | 9/2019 | Kang | G09G 3/3233 |
| 2020/0020754 A1* | 1/2020 | Kim | H05K 1/0281 |
| 2021/0098749 A1* | 4/2021 | Choi | H01L 27/1248 |
| 2021/0159466 A1* | 5/2021 | Kim | H01L 27/3272 |

* cited by examiner

*Primary Examiner* — Ricardo Osorio
(74) *Attorney, Agent, or Firm* — Polsinelli PC

(57) ABSTRACT

A touch display device includes a first substrate, an active layer disposed on the first substrate, a gate insulation film disposed on the first substrate with the active layer disposed thereon, a gate electrode disposed at a position overlapping with the active layer, an inter-layer insulation film disposed on the gate insulation film with the gate electrode disposed thereon, a pixel electrode disposed on the inter-layer insulation film, a first protection layer disposed on the inter-layer insulation film with the pixel electrode disposed thereon, a first electrode disposed on the first protection layer and connected to the active layer through a first contact hole, and a second electrode disposed on the inter-layer insulation film, connected to the active layer through a second contact hole, and connected to the pixel electrode through a third contact hole.

14 Claims, 12 Drawing Sheets

TOUCH DISPLAY DEVICE AND MANUFACTURING METHOD THEREOF

CROSS-REFERENCE TO RELATED APPLICATION

This application claims priority from Korean Patent Application No. 10-2019-0156908, filed on Nov. 29, 2019, which is hereby incorporated by reference in its entirety.

BACKGROUND

Field of the Disclosure

The present disclosure relates to a touch display device and a method of manufacturing the same.

Description of the Background

Along with the development of the information society, demands for display devices that display images are growing. In this regard, various types of display devices, such as liquid crystal display (LCD) devices, organic light emitting diode (OLED) display devices, and quantum dot display devices have been widely used.

A display device may operate in response to an input signal received through various input devices such as a keyboard and a mouse. A user may intuitively and conveniently input a user command to the display device by touching a screen using a touch panel. The touch panel is disposed on the screen of the display device, and the user may input a user command by touching a specific point on the screen of the display device. Further, the touch panel is integrally incorporated into the display device. A touch panel integrated into a display device may be referred to as a touch sensor. A display device including a touch sensor may be referred to as a touch display device.

As the touch display device includes the touch sensor, its thickness and manufacturing cost may be increased. However, the touch display device finds its wide use in devices such as smartphones and tablet personal computers (PCs). Users often move, carrying smartphones and tablet PCs and manipulate them with their hands. Therefore, if the smartphones and tablet PCs are made more lightweight and thinner, user convenience may be increased.

There exists a need for a technique of decreasing the thickness of a touch display device in spite of arrangement of a touch sensor in the touch display device. Further, a method of reducing the manufacturing cost of a touch display device in spite of addition of a touch sensor to the touch display device is required.

SUMMARY

Accordingly, the present disclosure is to provide a touch display device and a method of manufacturing the same, which may reduce manufacturing cost.

In addition, the present disclosure provides a touch display device of a small thickness and a method of manufacturing the same.

In an aspect of the present disclosure, a touch display device includes a first substrate, an active layer disposed on the first substrate, a gate insulation film disposed on the first substrate with the active layer disposed thereon, a gate electrode disposed at a position overlapping with the active layer, an inter-layer insulation film disposed on the gate insulation film with the gate electrode disposed thereon, a pixel electrode disposed on the inter-layer insulation film, a first protection layer disposed on the inter-layer insulation film with the pixel electrode disposed thereon, a first electrode disposed on the first protection layer and connected to the active layer through a first contact hole, and a second electrode disposed on the inter-layer insulation film, connected to the active layer through a second contact hole, and connected to the pixel electrode through a third contact hole.

In another aspect of the present disclosure, a method of manufacturing a touch display device includes disposing an active layer on a first substrate by patterning, disposing a gate insulation film on the first substrate with the active layer disposed thereon, disposing a gate electrode at a position overlapping with the active layer, on the gate insulation film by patterning, disposing an inter-layer insulation film on the gate insulation film with the gate electrode disposed thereon, disposing a pixel electrode on the inter-layer insulation film by patterning, disposing a first protection layer on the inter-layer insulation film with the pixel electrode disposed thereon, forming a first contact hole and a second contact hole which penetrate through the gate insulation film, the inter-layer insulation film, and the first protection layer to partially expose the active layer, and forming a third contact hole which penetrates through the first protection layer to partially expose the pixel electrode, and disposing, on the second protection layer, a first electrode contacting the active layer through the first contact hole, and a second electrode contacting the active layer through the second contact hole and contacting the pixel electrode through the third contact hole.

Further, the present disclosure provides a touch display device and a method of manufacturing the same which may reduce manufacturing cost.

DESCRIPTION OF DRAWINGS

The above and other features and advantages of the present disclosure will be more clearly understood from the following detailed description, taken in conjunction with the accompanying drawings, in which.

DETAILED DESCRIPTION

Figure 1:
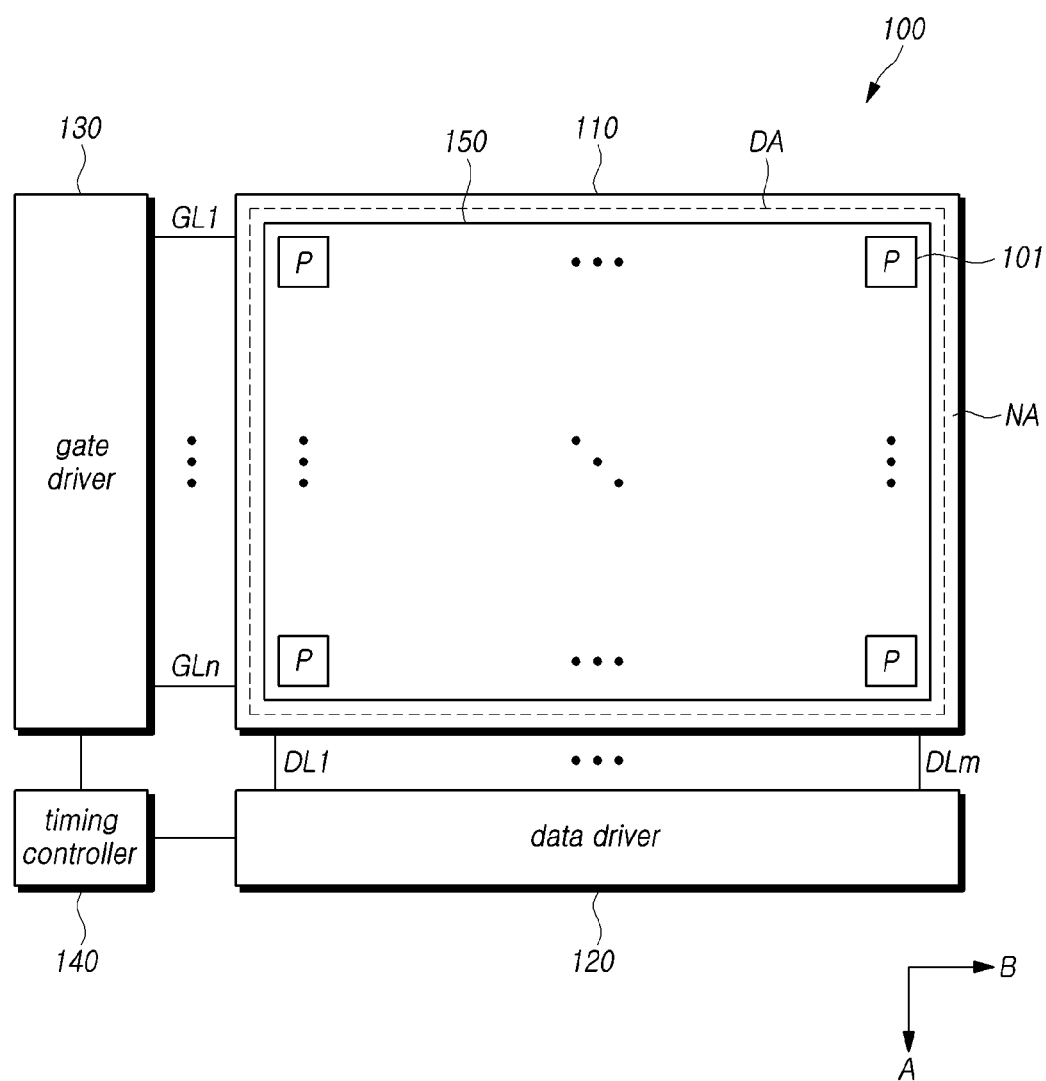
FIG. 1 is a diagram illustrating the structure of a touch display device according to the present disclosure.

In the following description of examples or aspects of the present disclosure, reference will be made to the accompanying drawings in which it is shown by way of illustration specific examples or aspects that can be implemented, and in which the same reference numerals and signs can be used to designate the same or like components even when they are shown in different accompanying drawings from one another. Further, in the following description of examples or aspects of the present disclosure, detailed descriptions of well-known functions and components incorporated herein will be omitted when it is determined that the description may make the subject matter in some aspects of the present disclosure rather unclear. The terms such as "including", "having", "containing", "constituting", "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after", "subsequent to", "next", "before", and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

FIG. 1 is a diagram illustrating the structure of a touch display device according to aspects of the present disclosure.

Referring to FIG. 1, a touch display device 100 may include a display panel 110, a data driver 120, a gate driver 130, and a timing controller 140.

The display panel 110 may include a plurality of data lines DL1 to DLm extending in a first direction A and a plurality of gate lines GL1 to GLn extending in a second direction B. The first direction A and the second direction B are shown as perpendicular to each other, which should not be construed as limiting the present disclosure.

Further, the display panel 110 may include a plurality of pixels 101. One pixel 101 may be connected to one data line and one gate line and operate by receiving a data signal which is transmitted through the connected data line in response to a gate signal transmitted through the connected gate line.

The display panel 110 may include a display area DA in which the plurality of pixels 101 are arranged and an image is displayed, and a non-display area NA in which wirings are arranged, including link wirings which transmit signals to the plurality of data lines DL1 to DLm and the plurality of gate lines GL1 to GLn.

The display panel 110 may be a liquid crystal display (LCD) panel. The display panel 110 includes pixel electrodes and common electrodes and applies a voltage to a liquid crystal layer in response to voltages applied to the pixel electrodes and the common electrodes. With the resulting change in the molecular orientation of liquid crystals, the transmittance of the liquid crystals may be adjusted, thereby representing grey scales. A plurality of pixel electrodes may be provided, and a different pixel electrode may correspond to each pixel. Further, there may be at least one common electrode, and one common electrode may be disposed in correspondence with at least two pixels.

A data voltage corresponding to a data signal may be applied to a pixel electrode, a predetermined voltage may be applied to a common electrode, and the difference between the voltages applied to the pixel electrode and the common electrode may change the molecular orientation of a liquid crystal.

The data driver 120 may be connected to the plurality of data lines DL1 to DLm and supply a data signal to a plurality of pixel electrodes through the plurality of data lines DL1 to DLm. The data driver 120 may include a plurality of source drivers. Each of the plurality of source drivers may be implemented as an integrated circuit (IC). The data signal transmitted by the data driver 120 may be applied to the pixel electrodes.

The gate driver 130 may be connected to the plurality of gate lines GL1 to GLn and supply a gate signal to the plurality of gate lines GL1 to GLn. Pixels receiving the gate signal through the gate lines may receive the data signal.

Although the gate driver 130 is shown as disposed outside the display panel 110, the gate driver 130 is not limited thereto. The gate driver 130 may include a gate signal generator disposed in the non-display area NA of the display panel 110. Further, the gate driver 130 may be implemented as a plurality of ICs.

Further, while the gate driver 130 is shown as disposed on one side of the display panel 110, the gate driver 130 is not limited thereto. Instead, gate drivers may be disposed on both sides of the display panel 110. The gate driver disposed on the left side of the display panel may be connected to odd-numbered gate lines, whereas the gate driver disposed on the right side of the display panel 110 may be connected to even-numbered gate lines.

The timing controller 140 may control the data driver 120 and the gate driver 130. The timing controller 140 may supply data control signals to the data driver 120 and gate control signals to the gate driver 130. The data control signals or the gate control signals may include, but not limited to, a clock, a vertical synchronization signal, a horizontal synchronization signal, and a start pulse.

Further, the timing controller 140 may supply a video signal to the data driver 120. The data driver 120 may generate a data signal based on the video signal and a data control signal received from the timing controller 140, and supply the data signal to the plurality of data lines.

Further, the touch display device 100 may include a touch sensor 150 disposed at a position overlapping with the display area DA of the display panel 110. While the touch sensor 150 is shown as disposed within the display area DA, the touch sensor 150 is not limited thereto. Instead, a part of the touch sensor 150 may be disposed outside the display area DA. The touch sensor 150 may identify that a user has touched the display panel 110 with the user's body or a pen, and generate information about the touched position.

The touch sensor 150 may detect a touch based on a change in capacitance, which should not be construed as limiting the touch sensor 150. The touch sensor 150 may be disposed on the display panel 110. The touch sensor 150 may also be disposed inside the display panel 110.

The touch sensor 150 may include common electrodes. That is, the common electrodes may receive a touch driving signal and perform touch sensing. Since the touch sensor 150 includes the common electrodes disposed in the display panel 110, the touch sensor 150 may be disposed inside the display panel 110. Further, because the touch sensor 150 does not include an additional electrode, the touch display device 100 may be made thin.

Figure 2:
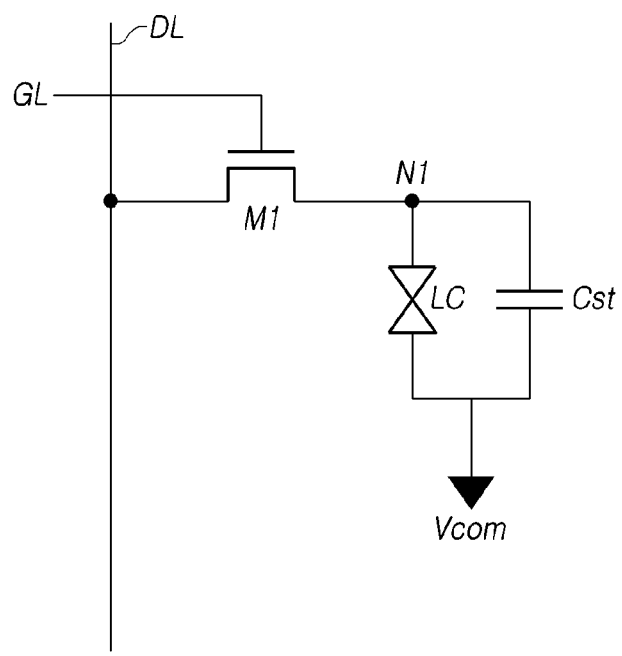
FIG. 2 is a circuit diagram illustrating a pixel according to the present disclosure.

FIG. 2 is a circuit diagram illustrating an aspect of a pixel according to aspects of the present disclosure.

Referring to FIG. 2, a pixel 101 may include a first transistor M1, a storage capacitor Cst, and a liquid crystal LC. The first transistor M1 may have a gate electrode connected to a gate line GL, and a first electrode connected to a data line DL and a first node N1. The storage capacitor Cst may have a first electrode connected to the first node N1 and a second electrode connected to a common electrode to which a common voltage Vcom is applied. The first electrode and the second electrode of the storage capacitor Cst may be connected to a pixel electrode and the common electrode, respectively.

When the first transistor M1 is turned on by a gate signal, a data voltage may be applied to the first node N1 through the data line DL. The common voltage Vcom is applied to the common electrode, and thus a voltage corresponding to the difference between the data voltage and the common voltage Vcom may be stored in the storage capacitor Cst.

The liquid crystal LC may be connected to the storage capacitor Cst in parallel. Therefore, the molecular orientation of the liquid crystal LC may be changed in correspondence with the voltage stored in the storage capacitor Cst. Further, the first electrode of the storage capacitor Cst may be connected to the pixel electrode, and the second electrode of the storage capacitor Cst may be connected to the common electrode.

The common voltage Vcom may be supplied to the common electrode and used to maintain the voltage of a data signal in the storage capacitor Cst.

Further, the common electrode may be included in the touch sensor 150. Therefore, a touch driving signal may be transmitted to the common electrode. When the touch driving signal is transmitted to the common electrode, the first transistor M1 may not be turned on, so that the data voltage is not transmitted to the pixel electrode.

Figure 3:
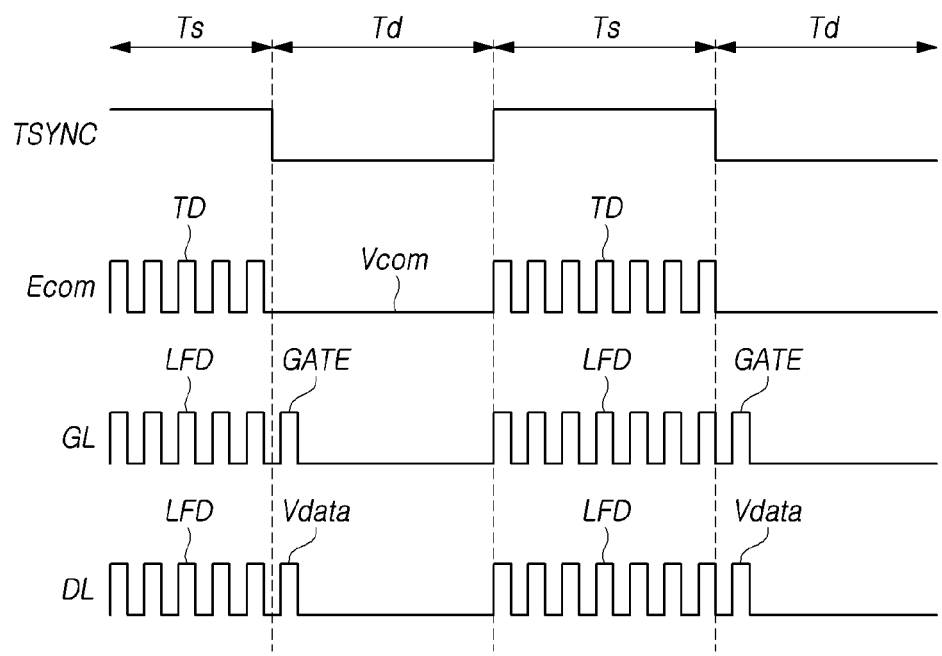
FIG. 3 is a timing diagram illustrating a method of driving the touch display device according to the present disclosure.

FIG. 3 is a timing diagram illustrating a process of driving the touch display device according to the present disclosure.

Referring to FIG. 3, a display period Td and a touch sensing period Ts may be defined for the touch display device 100. The display period Td may be a period during which signals for displaying an image are transmitted to the display panel 110, and the touch sensing period Ts may be a period during which a touch signal is transmitted to the touch sensor 150 and thus a touch is sensed.

Since the touch sensor 150 includes common electrodes, the touch display device 100 may operate separately in the display period Td and the touch sensing period Ts. The common voltage may be transmitted to the common electrodes in the display period Td, and the touch driving signal may be transmitted to the common electrodes in the touch sensing period Ts. The common voltage may be a direct current (DC) voltage at a predetermined voltage level. Further, the common voltage may be a ground. The touch driving signal may include a plurality of pulse waves having a predetermined frequency.

Further, a data signal Vdata and a gate signal GATE may be transmitted to the data lines DL and the gate lines GL in the display period Td. Further, in the touch sensing period Ts, a load free driving signal LFD having the same voltage level, phase, and frequency as the touch driving signal TD may be applied at least to the data lines DL and the gate lines GL. When the load free driving signal LFD is not applied in the touch sensing period Ts, voltage differences may occur between the common electrodes to which the touch driving signal TD is applied and the data lines DL and/or between the common electrodes and the gate lines GL. Thus, the touch display device 100 may increase power consumption due to the voltage differences.

On the contrary, when the load free driving signal LFD is applied to the data lines DL or the gate lines GL, no voltage difference may occur between the common electrodes and the data lines DL or between the common electrodes and the gate lines GL due to the load free driving signal LFD having the same voltage level, phase, and frequency as the touch driving signal TD. Therefore, power consumption of the touch display device 100 may be reduced. Herein, the same may cover a slight difference, not meaning exactly the same.

Figure 4:
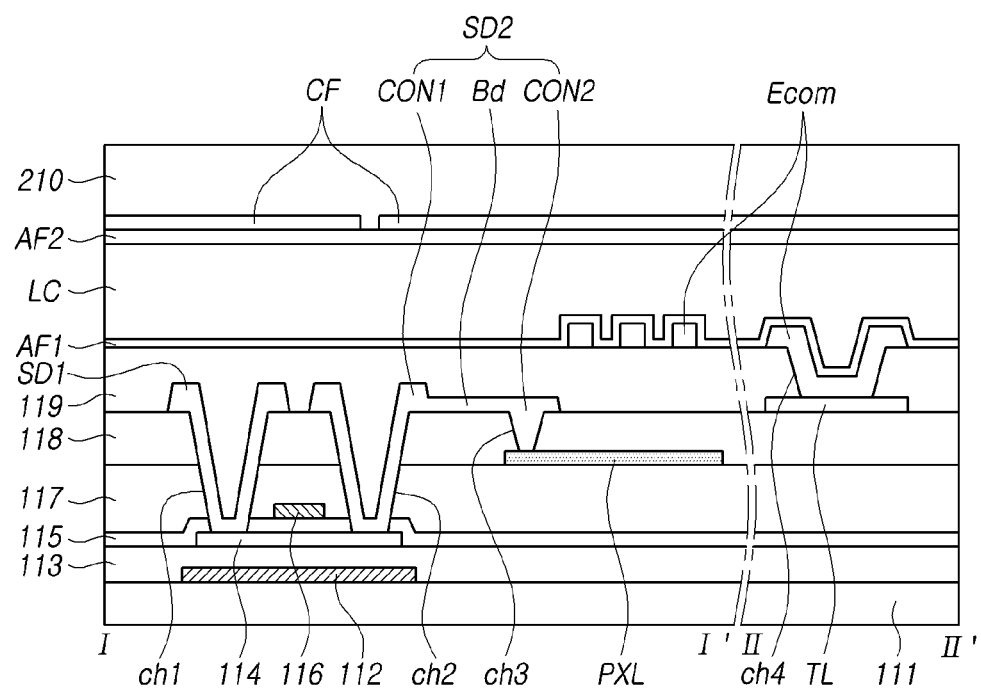
FIG. 4 is a cross-sectional view illustrating a part of the touch display device according to the present disclosure.

FIG. 4 is a cross-sectional view illustrating the structure of the touch display device according to aspects of the present disclosure.

Referring to FIG. 4, the touch display device 100 may include a first substrate 111, an active layer 114 disposed on the first substrate 111, a gate insulation film 115 disposed on the first substrate 111 with the active layer 114 disposed thereon, a gate electrode 116 disposed at a position overlapping with the active layer 114, an inter-layer insulation film 117 disposed on the gate insulation film 115 with the gate electrode 116 disposed thereon, a pixel electrode PXL disposed on the inter-layer insulation film 117, a first protection layer 118 disposed on the inter-insulation film 117 with the pixel electrode PXL disposed thereon, a first electrode SD1 disposed on the inter-insulation film 117 and connected to the active layer 114 through a first contact hole ch1, and a second electrode SD2 disposed on the first protection layer 118, connected to the active layer 114 through a second contact hole ch2, and connected to the pixel electrode PXL through a third contact hole ch3.

The first substrate 111 may be transparent. The first substrate 111 may include, but not limited to, glass. The active layer 114 may be formed of, but not limited to, low temperature polysilicon (LTPS). The active layer 114 may be disposed in a specific area on the first substrate 111.

The gate insulation film 115 may be an inorganic film. The gate electrode 116 may be disposed to partially overlap with the active layer 114. The part of the active layer 114 overlapping with the gate electrode 116 may be a channel region, and a part of the active layer 114 which does not overlap with the gate electrode 116 may doped and thus include a P-type or N-type semiconductor.

The inter-layer insulation film 117 may be an inorganic film. The top of the inter-insulation film 117 may be planarized. The pixel electrode PXL disposed on the inter-layer insulation film 117 may include a transparent electrode. The transparent electrode may include, but not limited to, indium tin oxide (ITO).

The first protection layer 118 may be an inorganic film. The first contact hole ch1 and the second contact hole ch2 may penetrate through the gate insulation film 115, the inter-layer insulation film 117, and the first protection layer 118. Further, the first contact hole ch1 or the second contact hole ch2 may partially expose the active layer 114. The first contact hole ch1 or the second contact hole ch2 may penetrate through the gate insulation film 115, the inter-layer insulation film 117, and the first protection layer 118 by an etching process performed after the first protection layer 118 is disposed, thereby exposing the active layer 114. The part of the active layer 114 exposed by the first contact hole ch1 or the second contact hole ch2 may be a P-type semiconductor or an N-type semiconductor.

Further, when the third contact hole ch3 is formed into the first protection layer 118, the gate insulation film 115 and the inter-layer insulation film 117 avoid etching due to the pixel electrode PXL disposed under the first protection film 118. Therefore, the third contact ch3 may partially expose the pixel electrode PXL.

The first electrode SD1 and the second electrode SD2 disposed on the first protection layer 114 may be brought into contact with the active layer 114 respectively through the first contact hole ch1 and the second contact hole ch2. The first electrode SD1 may be, but not limited to, a drain electrode, and the second electrode SD2 may be, but not limited to, a source electrode. Further, the second electrode SD2 may be connected to the pixel electrode PXL through the third contact hole ch3.

The second electrode SD2 may include a first contact portion CON1 connected to the active layer 114 through the second contact hole ch2, a second contact portion CON2 connected to the pixel electrode PXL through the third contact hole ch3, and a bridge Bd connecting the first contact portion CON1 to the second contact portion CON2. The pixel electrode PXL may receive a voltage through the second contact portion CON2.

The touch display device 100 may include a second protection layer 119 disposed on the first protection layer 118. The second protection layer 119 may be an inorganic film. A fourth contact hole ch4 may be formed into the second protection layer 119. Further, the touch display device 100 may include a common electrode Ecom disposed on the second protection layer 119 so as to overlap at least partially with the pixel electrode PXL. The common electrode Ecom may include at least one slit. The common electrode Ecom may include a transparent electrode. The transparent electrode may include, but not limited to, ITO or indium zinc oxide (IZO).

Further, the touch display device 100 may include a touch wiring TL disposed on the first protection layer 118. The fourth contact hole ch4 may overlap at least partially with the touch wiring TL. The common electrode Ecom may be connected to the underlying touch wiring TL through the fourth contact hole ch4. The common electrode Ecom may receive the common voltage Vcom or the touch driving signal TD through the touch wiring TL. The common voltage Vcom may be applied to the common electrode Ecom through the touch wiring TL in the display period illustrated in FIG. 3, and the touch driving signal TD may be transmitted to the common electrode Ecom through the touch wiring TL in the touch sensing period Ts.

Further, the touch display device 100 may include a light shielding layer 112 disposed at a position overlapping with the active layer 114, between the first substrate 111 and the active layer 114. The light shielding layer 112 may prevent light irradiated from under the first substrate 111 from reaching the active layer 114 to prevent leakage current from flowing into the active layer 114. The light shielding layer 112 may be, but not limited to, metal.

Further, the touch display device 100 may include a buffer layer 113 disposed between the light shielding layer 112 and the active layer 114. The buffer layer 113 may prevent foreign materials included in the first substrate 111 from being transferred to the active layer 114. The buffer layer 113 is shown as, but not limited to, a single layer. The buffer layer 113 may be a stack of a plurality of layers.

Further, a first alignment film AF1 may be disposed on the second protection layer 119 in the touch display device 100. A second substrate 210 may be disposed above the first alignment film AF1 by a predetermined gap. The second substrate 210 may have a second alignment film AF2 disposed on a surface facing the first alignment film AF1, and a color filter CF may be disposed between the second substrate 210 and the second alignment layer AF2.

Further, a liquid crystal layer LC may be disposed between the first alignment film AF1 and the second alignment film AF2. The molecular orientation of the liquid crystal layer LC may be determined by the first alignment film AF1 and the second alignment film AF2, and changed by the pixel electrode PXL and the common electrode Ecom. The resulting control of the transmittance of the liquid crystal layer LC may lead to representation of grey scales in the touch display device 100.

Further, when light which has passed through the liquid crystal layer LC passes through the color filter CF disposed in the second substrate 210, the color of the light may be determined by the color filter CF. A black matrix may further be disposed in the second substrate 210.

Figure 5:
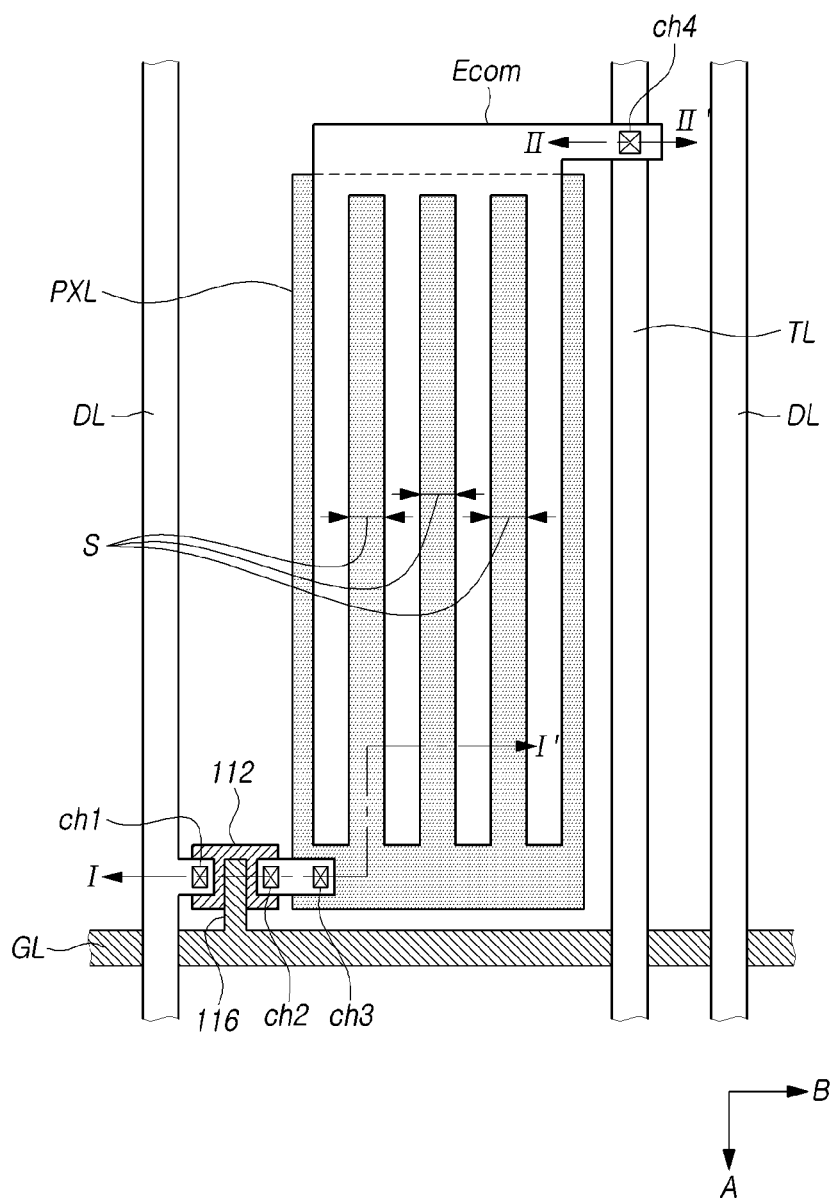
FIG. 5 is a plan view illustrating the structure of the touch display device according to the present disclosure.

FIG. 5 is a plan view illustrating a part of the touch display device according to aspects of the present disclosure.

Referring to FIG. 5, the touch display device 100 may include a data line DL arranged in the first direction A and a gate line GL arranged in the second direction B. The touch display device 100 may further include a touch line TL disposed in the first direction A.

A data voltage corresponding to a data signal may be applied to the data line DL, and a gate signal may be applied to the gate line GL. A touch driving signal may be applied to the touch line TL and a touch sensing signal may be output from the touch line TL. The data line DL and the touch line TL may be disposed on the same layer.

The active layer 112 may be disposed under the gate line GL, and the first electrode SD1 connected to the data line DL may be connected to the active layer 112 through the first contact hole ch1. Further, a pixel electrode PXL and a common electrode Ecom may be disposed in an area defined by the intersection of the data line DL and the gate line GL. The common electrode Ecom may be disposed on the pixel electrode PXL. Further, the common electrode Ecom may include slits S. The slits S may be elongated in, but not limited to, the first direction A. The slits S may be elongated in a direction defined between the first direction A and the second direction B.

The second electrode SD2 may be disposed on the pixel electrode PXL and contact the active layer 112 through the second contact hole ch2. Further, the second electrode SD2 may be connected to the pixel electrode PXL through the third contact hole ch3. The common electrode Ecom may be connected to the touch wiring TL through the fourth contact hole ch4.

FIGS. 6A to 6D are diagrams illustrating a process of manufacturing the touch display device according to aspects of the present disclosure.

Figure 6A:
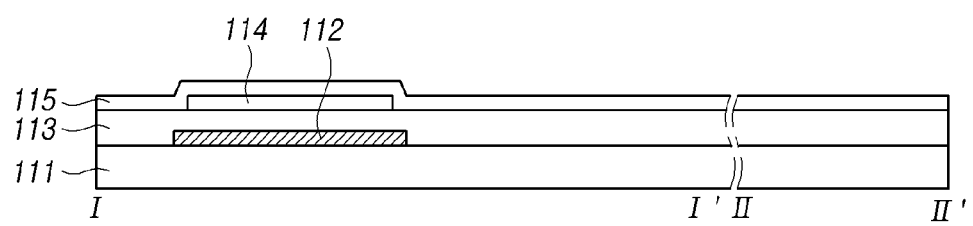
FIGS. 6A to 6G are diagrams illustrating a process of manufacturing the touch display device according to aspects of the present disclosure.

Referring to FIG. 6A, the active layer 114 may be disposed on the first substrate 111 by patterning. The first substrate 111 may be transparent. The active layer 114 may be disposed in a specific area on the first substrate 111 using a mask. The gate insulation layer 115 may be disposed on the first substrate 111 with the active layer 114 disposed thereon. Further, the light shielding layer 112 may be disposed at a position overlapping with the active layer 114, between the first substrate 111 and the active layer 114. The light shielding layer 112 may be metal. The light shielding layer 112 may prevent light from being irradiated to the active layer 114, thereby preventing leakage current from flowing in the active layer 114.

Figure 6B:
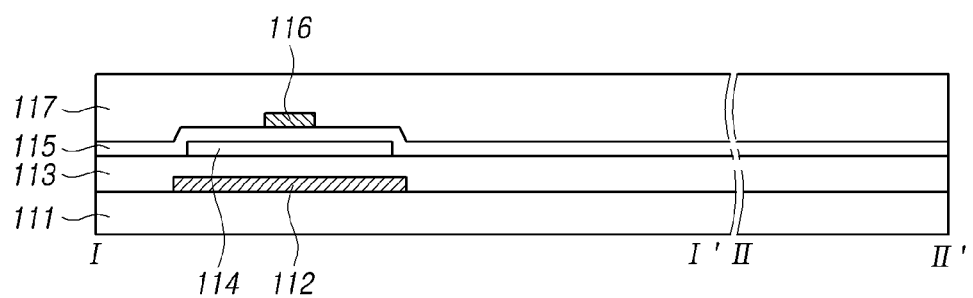

Referring to FIG. 6B, the gate electrode 116 may be disposed on the gate insulation film 115 at a position overlapping with the active layer 114 by patterning. The gate electrode 116 may be disposed at a position overlapping with the active layer 114 by depositing and patterning a gate metal. The inter-layer insulation film 117 may be disposed on the gate insulation film 115 with the gate electrode 116 disposed thereon. The top of the inter-layer insulation film 117 may be flat.

Figure 6C:
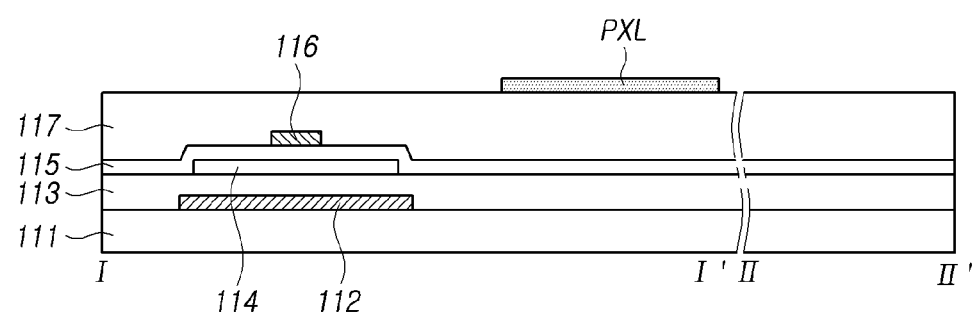

Referring to FIG. 6C, the pixel electrode PXL may be disposed on the inter-layer insulation film 117 by patterning. The pixel electrode PXL may be disposed in, but not limited to, an area that does not overlap with the active layer 114. The first protection layer 118 may be disposed on the inter-layer insulation film 117 with the pixel electrode PXL disposed thereon.

Figure 6D:
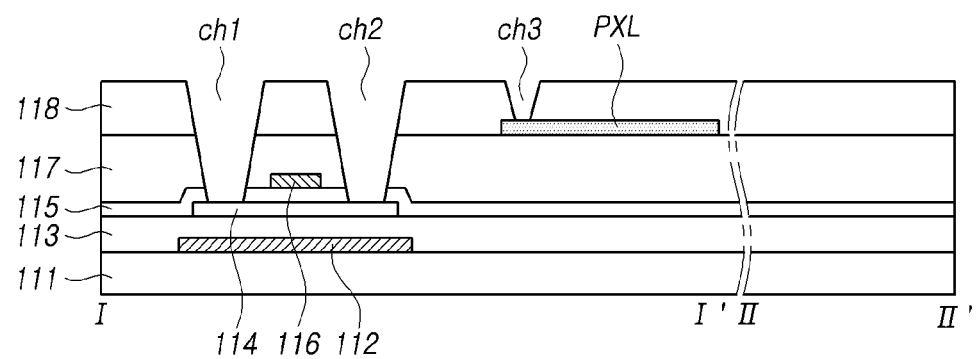

Referring to FIG. 6D, after the first protection layer 118 is disposed, the first contact hole ch1, the second contact hole ch2, and the third contact hole ch3 may be formed. The first contact hole ch1 and the second contact hole ch2 may penetrate through the first protection layer 118, the inter-layer insulation film 117, and the gate insulation film 115, to expose the active layer 114 at least partially. The first contact hole ch1 and the second contact hole ch2 may be formed by penetrating the first protection layer 118, the inter-layer insulating film 117, and the gate insulation film 115 in one process. That is, because the first contact hole ch1 and the second contact hole ch2 may be formed into the first protection layer 118, the inter-layer insulation film 117, and the gate insulation film 115 using one mask, the number of masks may be reduced, which may in turn reduce the manufacturing cost of the touch display device 100.

The third contact hole ch3 may be formed through the first protection layer 118 in the process of forming the first contact hole ch1 and the second contact hole ch2. The third contact hole ch3 may be formed at a position overlapping with the pixel electrode PXL without penetrating through the inter-layer insulation film 117 and the gate insulation film 115 due to the pixel electrode PXL. The pixel electrode PXL may be exposed at least partially by the third contact hole ch3. Further, since the third contact hole ch3 is formed along with the first contact hole ch1 and the second contact hole ch2, the first contact hole ch1, the second contact hole ch2, and the third contact hole ch3 may be formed by using the same mask, thereby reducing manufacturing cost.

Figure 6E:
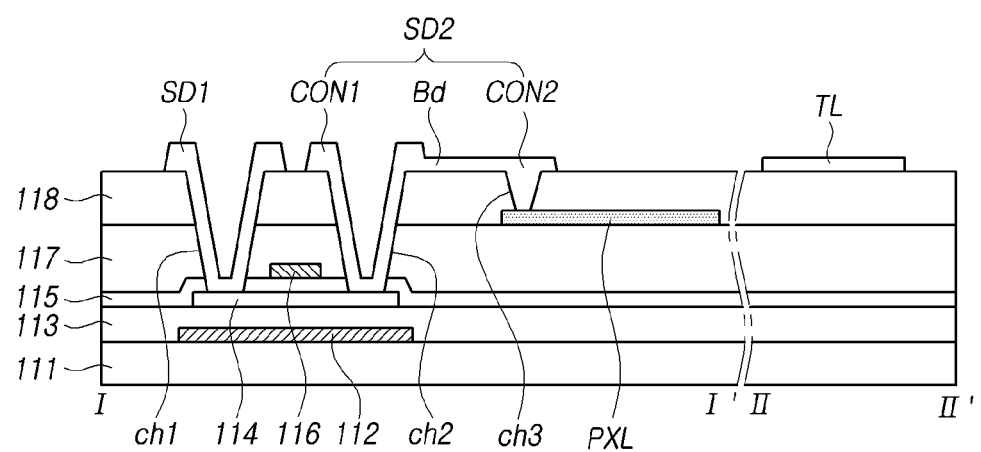

Referring to FIG. 6E, the first electrode SD1 and the second electrode SD2 may be disposed on the first protection layer 118. As the first electrode SD1 and the second electrode SD2 are disposed at positions overlapping with the first contact hole ch1 and the second contact hole ch2, respectively, the first electrode SD1 may contact the active layer 114 through the first contact hole ch1, and the second electrode SD2 may contact the active layer 114 through the second contact hole ch2.

Further, the second electrode SD2 may be disposed at a position overlapping with the third contact hole ch3, so that the second electrode SD2 may contact the pixel electrode PXL through the third contact hole ch3. The second electrode SD2 may include the first contact portion CON1, the second contact portion CON2, and the bridge Bd connecting the first contact portion CON1 to the second contact portion CON2.

The first contact portion CON1 may contact the active layer 114 through the second contact hole ch2, and the second contact portion CON2 may be disposed on the pixel electrode PXL through the third contact hole ch3. The first electrode SD1 may be, but not limited to, a drain electrode of a transistor, and the second electrode SD2 may be, but not limited to, a source electrode of the transistor.

Further, the touch wiring TL may be disposed on the first protection layer 118. The touch wiring TL may be disposed at a position not overlapping with the active layer 114 and the pixel electrode PXL. Further, the touch wiring TL may include the same metal as the first electrode SD1 and the second electrode SD2. The touch wiring TL may be disposed on the first protection layer 118, along with the first electrode SD1 and the second electrode SD2.

Figure 6F:
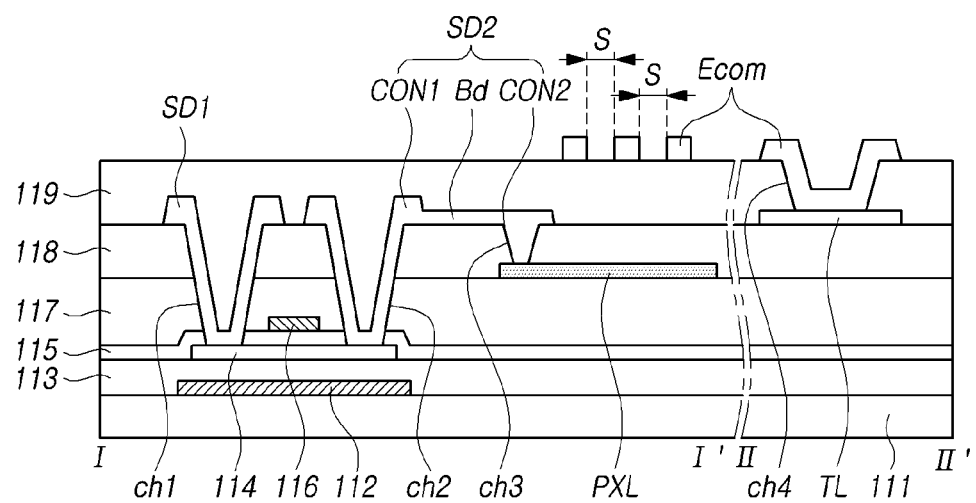

Referring to FIG. 6F, the second protection layer 119 may be disposed on the first protection layer 118 with the first electrode SD1, the second electrode SD2, and the touch wiring TL disposed thereon. Further, the common electrode Ecom may be disposed on the second protection layer 119. The common electrode Ecom may include a transparent electrode. The common electrode Ecom may include slits S. The common electrode Ecom may be disposed at a position overlapping with the pixel electrode PXL.

Further, the fourth contact hole ch4 may be disposed at a position overlapping with the touch wiring TL in the second protection layer 119, and the common electrode Ecom may contact the touch wiring TL through the fourth contact hole ch4.

Figure 6G:
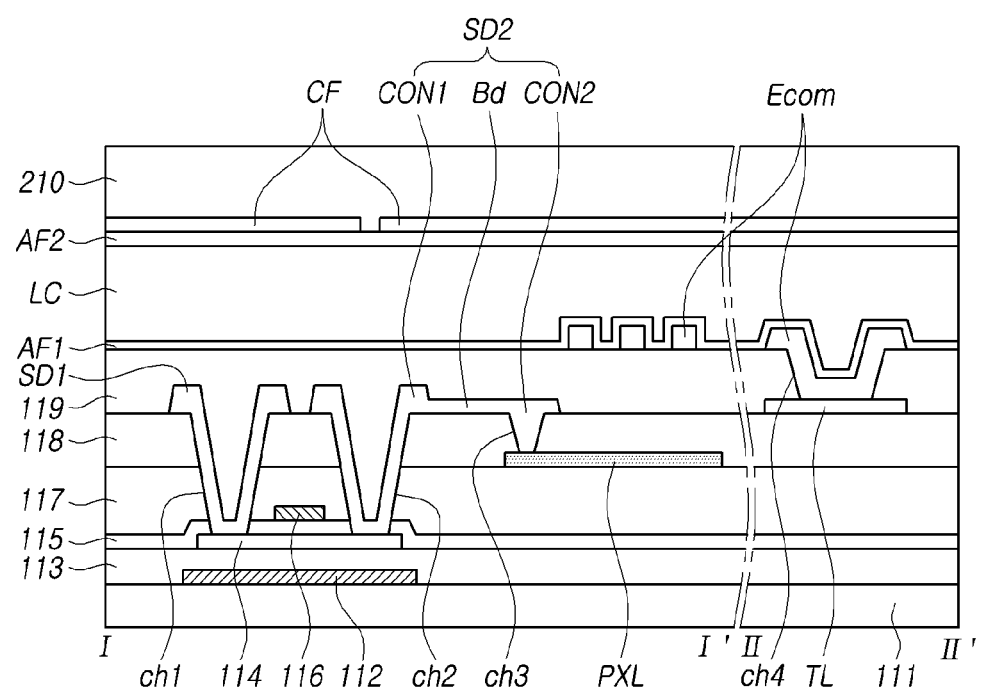

Referring to FIG. 6G, the first alignment film AF1 may be disposed on the second protection layer 119. The second substrate 210 may be disposed on the first alignment film AF1. The color filter CF may be disposed on the second substrate 210. The second alignment film AF2 may be disposed on the second substrate 210. Further, the liquid crystal layer LC may be disposed between the first alignment film AF1 and the second alignment film AF2. The second substrate 210 may be a transparent substrate.

The above description has been presented to enable any person skilled in the art to make and use the technical idea of the present disclosure, and has been provided in the context of a particular application and its requirements. Various modifications, additions and substitutions to the described aspects will be readily apparent to those skilled in the art, and the general principles defined herein may be applied to other aspects and applications without departing from the spirit and scope of the present disclosure. The above description and the accompanying drawings provide an example of the technical idea of the present disclosure for illustrative purposes only. That is, the disclosed aspects are intended to illustrate the scope of the technical idea of the present disclosure. Thus, the scope of the present disclosure is not limited to the aspects shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. A touch display device comprising:
    a first substrate;
    an active layer disposed on the first substrate;
    a gate insulation film disposed on the first substrate including the active layer;
    a gate electrode disposed at a position overlapping with the active layer;
    an inter-layer insulation film disposed on the gate insulation film including the gate electrode;

a pixel electrode disposed on the inter-layer insulation film;

a first protection layer disposed on the inter-layer insulation film including the pixel electrode;

a first electrode disposed on the first protection layer and connected to the active layer through a first contact hole; and a second electrode disposed on the inter-layer insulation film, connected to the active layer through a second contact hole, and connected to the pixel electrode through a third contact hole.

2. The touch display device according to claim 1, wherein the second electrode includes a first contact portion connected to the active layer through the second contact hole, a second contact portion connected to the pixel electrode through the third contact hole, and a bridge connecting the first contact portion to the second contact portion.

3. The touch display device according to claim 1, further comprising:

a second protection layer disposed on the first protection layer; and a common electrode including at least one slit and disposed on the second protection layer, wherein the common electrode overlaps at least partially with the pixel electrode.

4. The touch display device according to claim 3, further comprising a touch wiring disposed on the first protection layer, wherein the common electrode is connected to the touch wiring through a fourth contact hole formed into the second protection layer.

5. The touch display device according to claim 3, wherein at least one of the common electrode and the pixel electrode is a transparent electrode.

6. The touch display device according to claim 3, further comprising:

a liquid crystal layer disposed on the second protection layer; and a second substrate including a color filter, which is disposed on the liquid crystal layer.

7. The touch display device according to claim 1, further comprising a light shielding layer disposed at a position overlapping with the active layer between the first substrate and the active layer.

8. The touch display device according to claim 7, further comprising a buffer layer disposed between the light shielding layer and the active layer.

9. A method of manufacturing a touch display device, comprising:

forming an active layer on a first substrate by patterning;

forming a gate insulation film on the first substrate with the active layer disposed thereon;

forming a gate electrode at a position overlapping with the active layer, on the gate insulation film by patterning;

forming an inter-layer insulation film on the gate insulation film with the gate electrode disposed thereon;

forming a pixel electrode on the inter-layer insulation film by patterning;

forming a first protection layer on the inter-layer insulation film with the pixel electrode disposed thereon;

forming a first contact hole and a second contact hole which penetrate through the gate insulation film, the inter-layer insulation film, and the first protection layer to partially expose the active layer, and forming a third contact hole which penetrates through the first protection layer to partially expose the pixel electrode; and forming, on the second protection layer, a first electrode contacting the active layer through the first contact hole, and a second electrode contacting the active layer through the second contact hole and contacting the pixel electrode through the third contact hole.

10. The method according to claim 9, further comprising forming a touch wiring on the first protection layer by patterning.

11. The method according to claim 9, further comprising forming a common electrode on the second protection layer by patterning, and forming a fourth contact hole into the second protection layer, to bring at least a part of the common electrode into contact with the touch wiring through the fourth contact hole.

12. The method according to claim 11, further comprising forming a second substrate including a color filter above the second substrate by a predetermined gap and disposing a liquid crystal layer in the predetermined gap.

13. The method according to claim 11, wherein at least one of the pixel electrode or the common electrode includes a transparent electrode.

14. The method according to claim 9, further comprising forming a light shielding layer between the first substrate and the active layer by patterning and then disposing a buffer layer on the first substrate with the light shielding layer disposed thereon.

* * * * *